United States Patent [19]
Nobel et al.

[11] Patent Number: 5,953,028
[45] Date of Patent: *Sep. 14, 1999

[54] INTERCONNECT SCHEME FOR MOUNTING DIFFERENTLY CONFIGURED PRINTHEADS ON THE SAME CARRIAGE

[75] Inventors: Gary M. Nobel, San Diego; Majid Azmoon, Poway; Donald G. Harris, Escondido, all of Calif.

[73] Assignee: Hewlett-Packard Company, Palo Alto, Calif.

[*] Notice: This patent is subject to a terminal disclaimer.

[21] Appl. No.: 08/957,525

[22] Filed: Oct. 24, 1997

Related U.S. Application Data

[62] Division of application No. 08/145,367, Oct. 29, 1993, Pat. No. 5,684,518.

[51] Int. Cl.$^6$ ....................................................... B41S 2/14
[52] U.S. Cl. ................................................ 347/50; 347/37
[58] Field of Search .................................. 347/49, 50, 32, 347/40, 43, 86, 87

[56] References Cited

U.S. PATENT DOCUMENTS 5,684,518  11/1997  Nobel et al. .............................. 347/50

*Primary Examiner*—Benjamin R. Fuller
*Assistant Examiner*—Craig A. Hallacher
*Attorney, Agent, or Firm*—David S. Romney

[57] ABSTRACT

A printer/plotter having a carriage for removably mounting a plurality of printheads, with one type of printhead such as a wider swath higher resolution black inkjet cartridge having one type of electrical interconnect and another type of printhead such as a narrower swath lower resolution color inkjet cartridge having a different type of electrical interconnect. The carriage includes differently configured flex-circuit conductive assemblies for each different type of electrical interconnect without having to change the datum configuration of the cartridges mounted in the carriage.

19 Claims, 12 Drawing Sheets

INTERCONNECT SCHEME FOR MOUNTING DIFFERENTLY CONFIGURED PRINTHEADS ON THE SAME CARRIAGE

CROSS REFERENCE TO RELATED APPLICATION(S)

This is a divisional of application Ser. No. 08/145,367 filed on Oct. 29, 1993 now U.S. Pat. No. 5,684,518.

RELATED APPLICATIONS

This application is related to co-pending application U.S. Ser. No. 08/145,261 filed Oct. 29, 1993 entitled "Mixed Resolution Printing For Color And Monochrome Printers", which application is assigned to the assignee of this application and is incorporated herein by reference.

This application also relates to the following co-pending applications which are commonly owned by the assignee of this application and which are incorporated herein by reference:

U.S. Ser. No. 08/56,345 filed Apr. 30, 1993 entitled "Electrical Interconnect System For A Printer" now U.S. Pat. No. 5,461,482; U.S. Ser. No. 08/55,618 filed Apr. 30, 1993 entitled "Modular Carriage Assembly For An Inkjet Printer" subsequently issued as U.S. Pat. No. 5,539,436; U.S. Ser. No. 08/56,009 filed Apr. 30, 1993 entitled "Wiping Structure For Cleaning Electrical Contacts For A Printer And Ink Cartridge" now issued as U.S. Pat. No. 5,598,194; U.S. Ser. No. 08/56,961 filed May 3, 1993 entitled "Method And Device For Preventing Unintended Use Of Print Cartridges" now issued as U.S. Pat. No. 5,519,422; U.S. Ser. No. 08/57,241 filed Apr. 30, 1993 entitled "Side Biased Datum Scheme For Inkjet Cartridge And Carriage" now issued as U.S. Pat. No. 5,646,665; and U.S. Ser. No. 07/958,833 filed Oct. 8, 1992 entitled "Printhead With Reduced Interconnections To A Printer" subsequently issued as U.S. Pat. No. 5,541,629.

BACKGROUND OF THE INVENTION

This invention relates generally to printers/plotters, and more specifically to print carriages having inkjet print cartridges removably mounted thereon.

It is common to have several inkjet print cartridges in a single carriage of an inkjet printer. But in some instances these cartridges may have different capabilities and therefore have different electrical interconnect designs connecting the cartridges to the printer. For example, the number and pattern of electrical contacts may differ between the different types of cartridges, such as in cartridges which have different print resolutions.

Many multi-pen set printers have addressed the issue of improving output quality and the speed of output without increasing the resolution of the entire pen set and thus their cost and complexity. Some have improved output quality through improved addressability and some through improved printing algorithms. In such cases the improved output quality is not as good as the output quality from the higher resolution pen of the multi-resolution pen set.

Typically in inkjet printers, one print cartridge is black, another is a tri-compartment color cartridge, or a separate color cartridge is provided for each color component (e.g., cyan, magenta, yellow). The different types of nozzle arrays and differently designed color and black print cartridges, as well as other unique printhead characteristics all create the need for an inexpensive but reliable way to successfully mount such different cartridges into the same carriage.

BRIEF SUMMARY OF THE INVENTION

A principal object of the invention is to incorporate printheads having different types of electrical interconnects into the same carriage in order to expand the capabilities of the printer to achieve high quality printing as well as greater throughput. A related object is to decrease research and development costs as well as decrease the time for bringing higher resolution printers to market.

It is a primary object of the invention to adapt a print carriage for removably mounting differently configured print cartridges at the same time in the same carriage without having to change the datum configuration for the print cartridges.

Another object is to provide a modified interconnect scheme for a carriage mounted flex-circuit member having an increased number of conductive pads spread over an enlarged area without having to change the size of the carriage chute for receiving a print cartridge. A related object is to provide a simplified unitary resilient member made of foam or the like which assures pressurized interconnection of all of the increased number of conductive pads over their enlarged area.

A further object is to provide an interconnect scheme which allows removably mounted print cartridges with different nozzle array densities activated by differently configured conductive pad arrays to be simultaneously seated in a carriage having substantially identical mounting chutes.

In its preferred form, the invention provides a modular carriage having a customized flex-circuit frame for interconnecting three separate color printheads each having thirty-two conductive interconnect pads in a four-column array in conjunction with a first corresponding resilient scheme, as well as for interconnecting at the same time a single separate black printhead having fifty-two conductive interconnect pads in a six-column array in conjunction with a newly developed resilient scheme. The color printheads each have approximately one-hundred nozzles arrayed in a swath of approximately ⅓ inch to achieve a 300 dpi resolution, and the black printhead has three-hundred nozzles arrayed in a ½ inch swath in order to achieve a 600 dpi print resolution.

DETAILED DESCRIPTION OF THE PREFERRED EMBODIMENT

In a multiple pen printer, it is important to improve the output quality of a printed page and increase the speed at which that output can be obtained as economically and simply as possible. In a printer mechanism, the output quality of a printed page is a function of printhead resolution. The higher the resolution the better the print quality. Also, in a swath printer employing a scanning carriage, the speed at which the output can be obtained is a function of the width of the swath which is covered by the printhead.

In current multi-pen printers, each pen has the same resolution and usually the same swath width. This means that all the supporting structure, mechanics and electronics needs to be scaled up to support the resolution of the entire set of pens. All this hardware is more expensive than the hardware to support a multi-resolution, multi-swath width pen set where one pen is at the higher resolution and larger width that is desired and the other pens in the set are at a lower resolution and smaller size.

This invention provides the benefits of a higher resolution, larger swath pen in lower resolution, smaller swath pens in the same printing machine. The higher performance pen can be used to improve output quality by enhancing certain key features that appear frequently in a printed page such as text. Such a pen also improves throughput by being able to print these frequent features faster. The other lower performance pens can be used for less frequent or less demanding features such as graphics.

In the presently preferred embodiment of the invention disclosed herein, we have combined a 600 dpi ½ inch swath black pen with three 300 dpi color pens each generating a swath of approximately ⅓ inch. The high performance black pen is typically used for printing text and other "black only" features, and thus the output quality and throughput of these features is greater. It also improves the output quality of color graphics and color features by teaming with the three lower performance color pens when printing color graphics or color features. The black component of the graphics which is often a large portion of color graphics content is at a higher resolution and thus at a higher output quality level. The larger swath can then be combined with printing algorithms to improve the throughput of color graphics.

Figure 1:
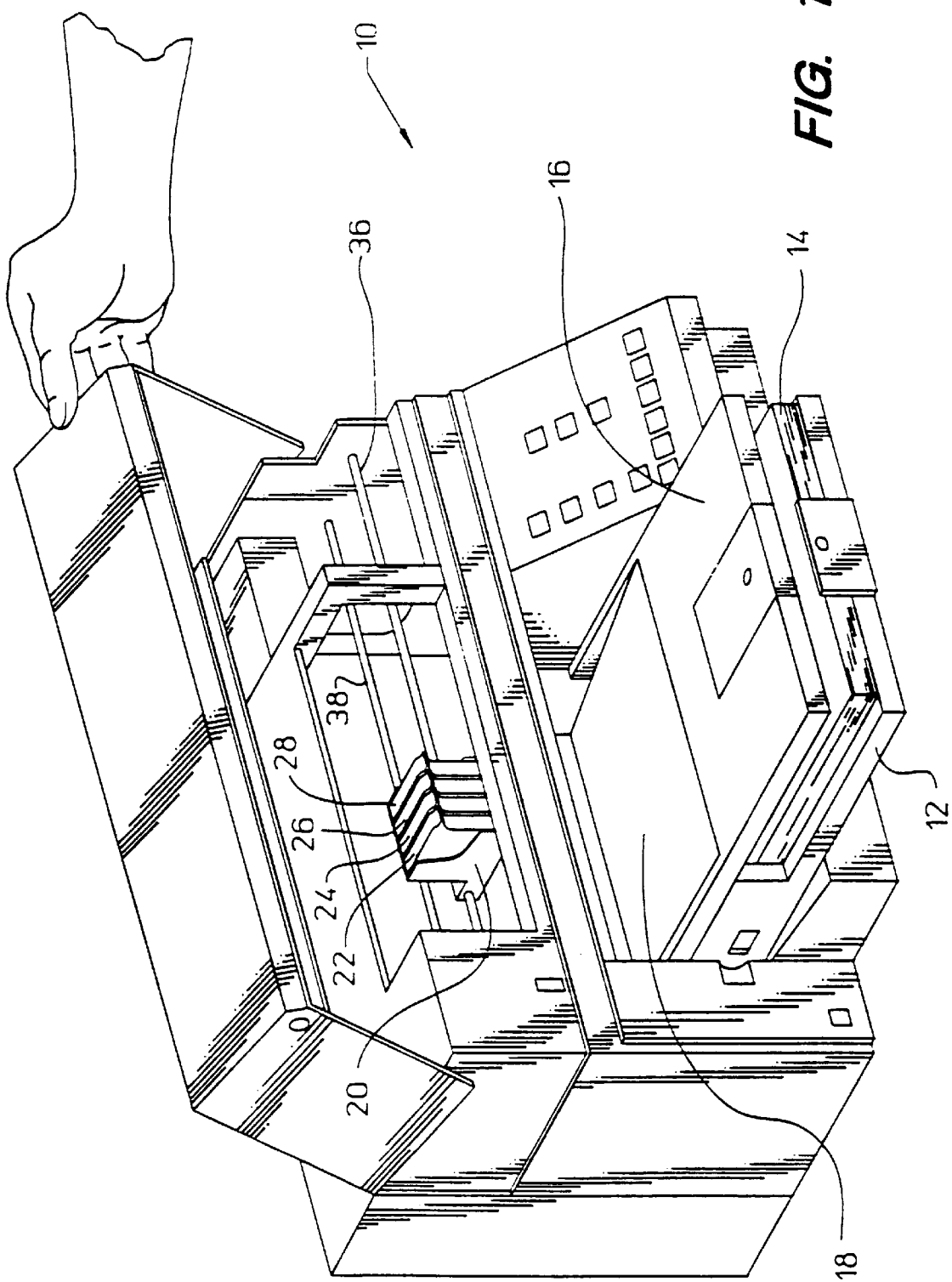
FIG. 1 shows a typical inkjet printer which can incorporate the apparatus and method of the present invention.
Figure 2:
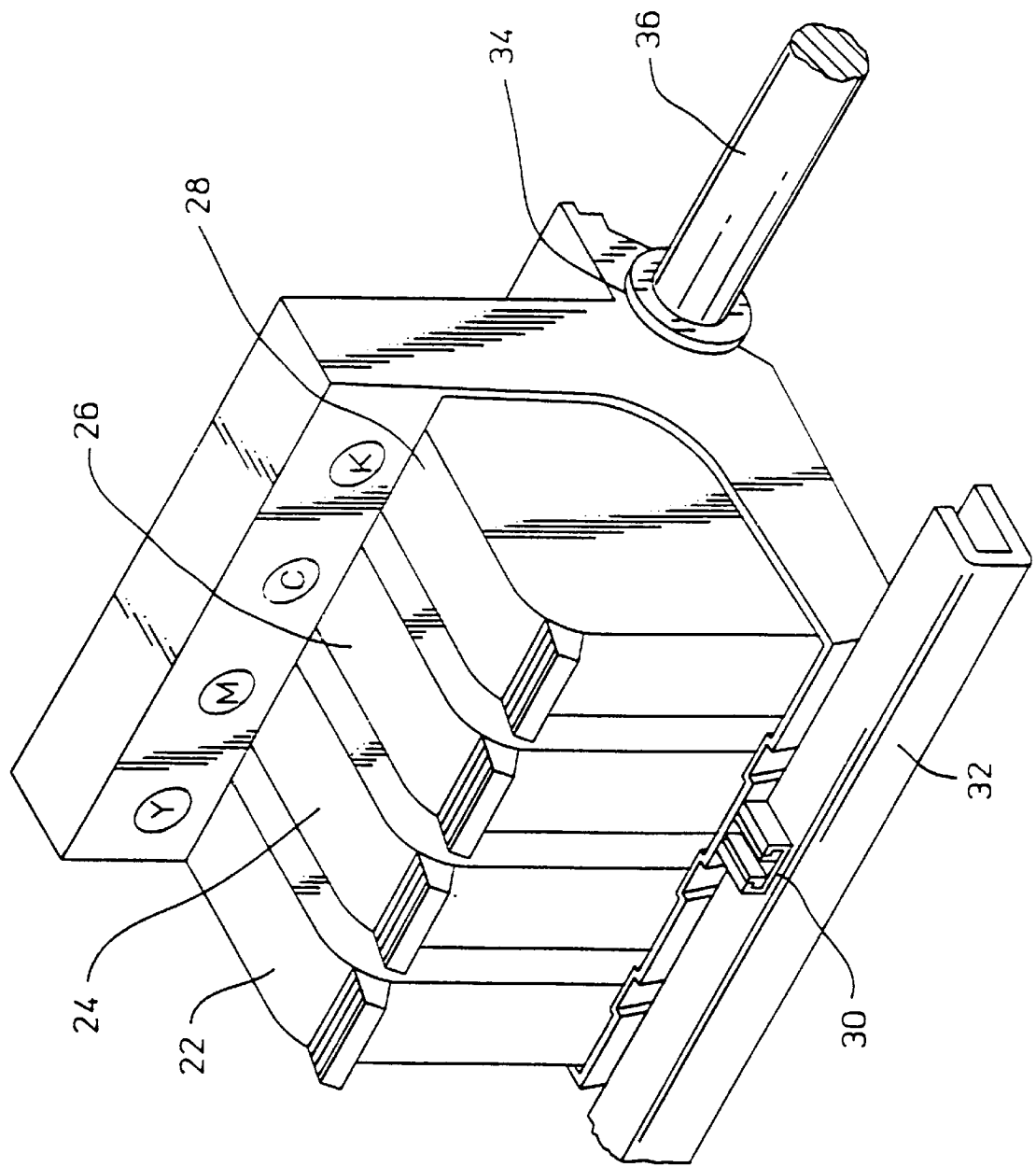
FIG. 2 shows a carriage having removable multi-color print cartridges, which can incorporated the apparatus and method of the present invention.
Figure 3:
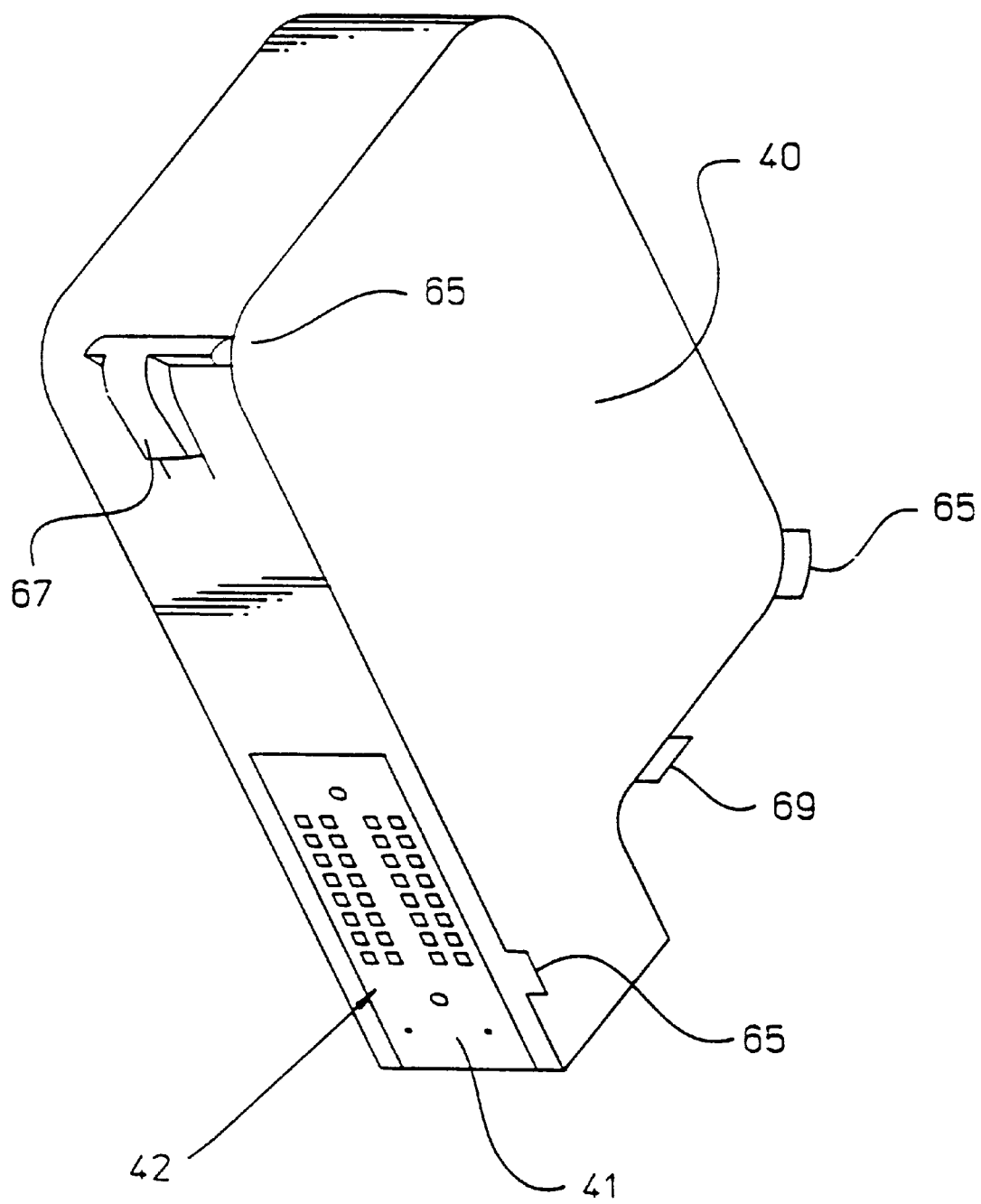
FIG. 3 shows an exemplary lower resolution color inkjet print cartridge used in a presently preferred embodiment of the invention.
Figure 4:
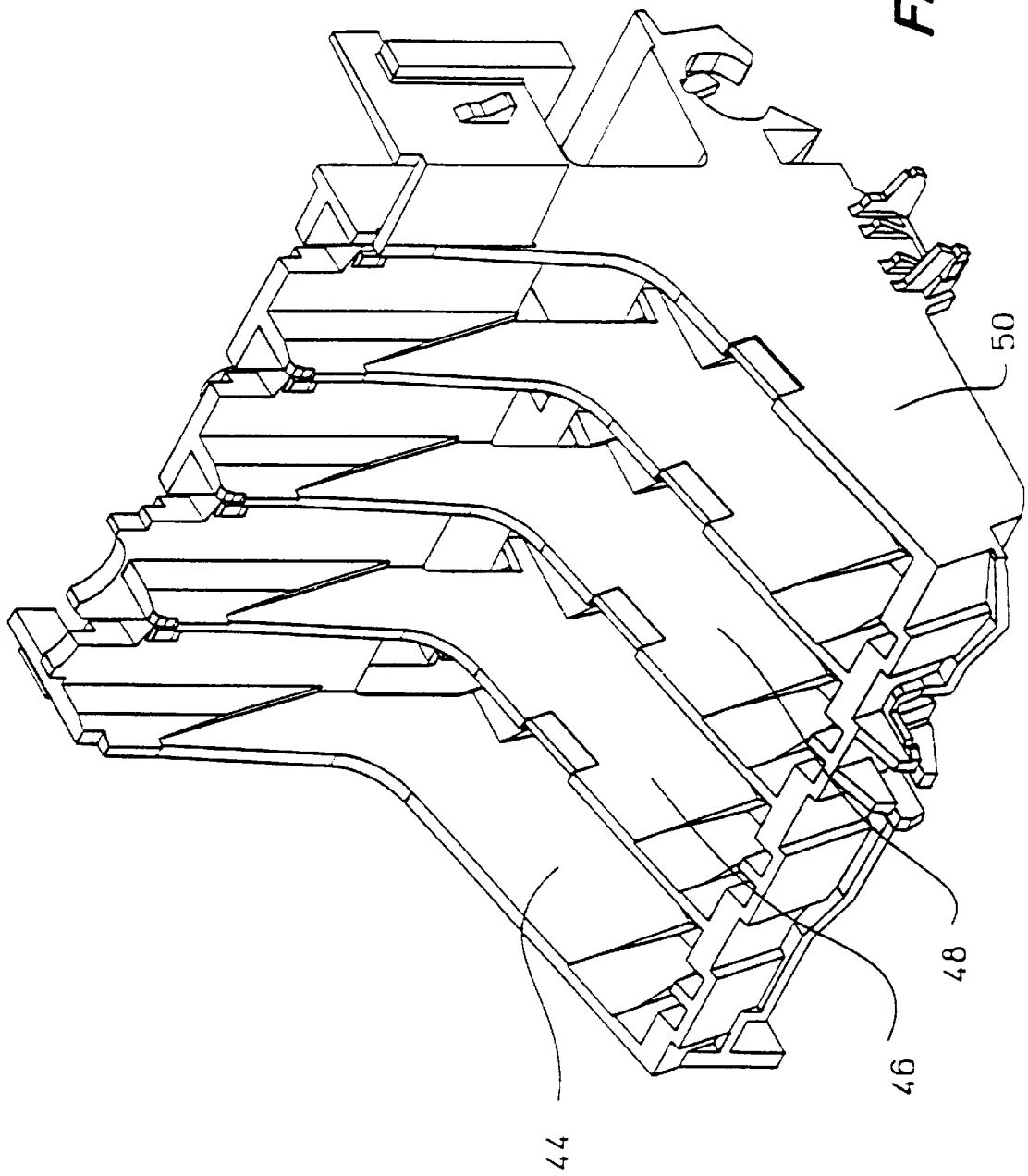
FIG. 4 is a perspective view of a carriage incorporating presently preferred embodiment of the invention in an inkjet printer.
Figure 5:
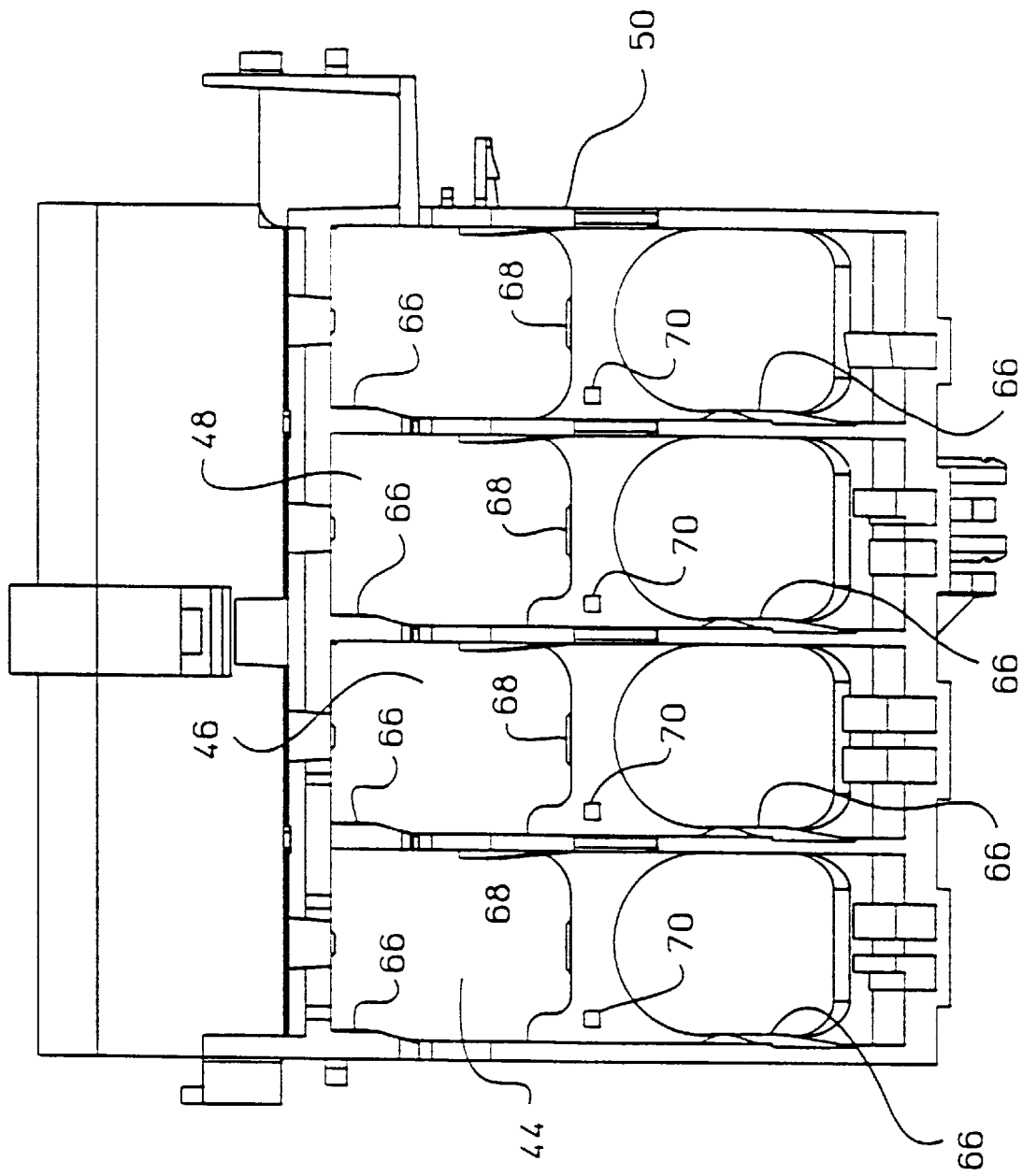
FIG. 5 is a top view of the carriage of FIG. 4.
Figure 6:
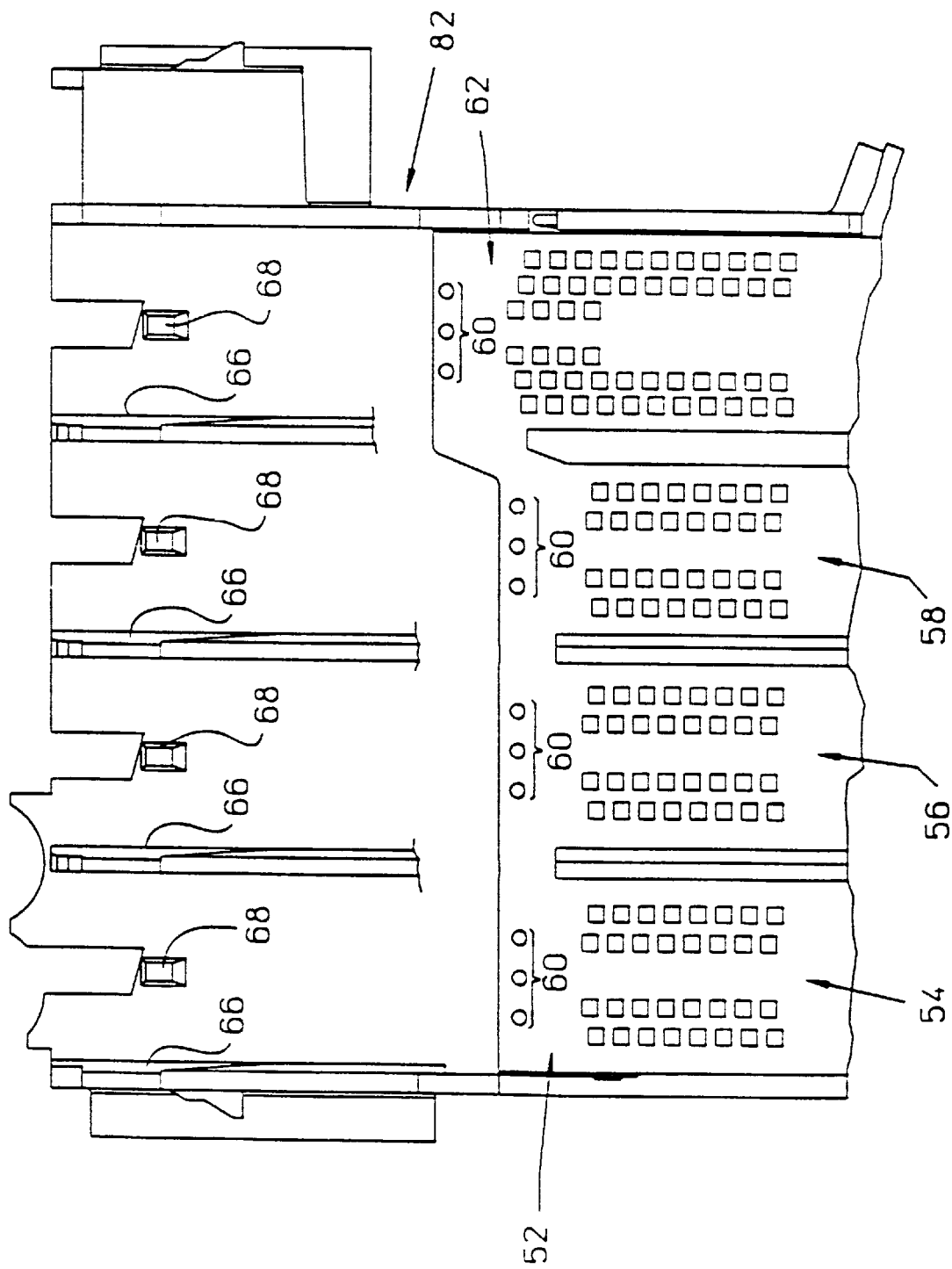
FIG. 6 is a fragmentary view of the flex-circuit interconnect on the carriage of FIGS. 4 and 5, with the interior carriage walls cut away.

Even though the invention can be used in any printing environment where text and/or graphics are applied to media using monochrome and/or color comoponents, the presently preferred embodiment of the invention is used in an inkjet printer of the type shown in FIG. 1. In particular, inkjet printer 10 includes an input tray 12 containing sheets of media 14 which pass through a print zone, and are fed past an exit 18 into an output tray 16. Referring to FIGS. 1–2, a movable carriage 20 holds print cartridges 22, 24, 26, and 28 which respectively hold yellow (Y), magenta (M), cyan (C) and black (K) inks. The front of the carriage has a support bumper 30 which rides along a guide 32 while the back of the carriage has multiple bushings such as 34 which ride along slide rod 36. The position of the carriage as it traverses back and forth across the media is determined from an encoder strip 38 in order to be sure that the various ink nozzles on each print cartridge are selectively fired at the appropriate time during a carriage scan.

Referring to FIGS. 3–6, a 300 dpi color inkjet cartridge 40 having a tab-circuit with a four column thirty-two pad electrical interconnect 42 is removably installed in three chutes 44, 46, 48 of a unitary carriage 50. A flex-circuit member 52 having three matching sets of conductive pads 54, 56, 58 is mounted on flex-frame pins 60 for operative engagement with the cartridge pads when the cartridge is inserted into its appropriate chute. An enlarged set of conductive pads 62 covering a larger area, having a different layout, and constituting an array of six columns totaling fifty-two conductive pads on the flex-circuit member is designed for operative engagement with cartridge pads on a 600 dpi black injet cartridge 64 (see FIG. 9).

The preferred structure and techniques for preventing mistaken installation of a 600 dpi black printhead in a color printhead chute, or alternatively the mistaken installation of a 300 dpi color printhead in a black printhead chute is described in the copending applications identified above and incorporated by reference herein.

Because of the differently configured electrical interconnect on the 600 dpi cartridge, and in order to avoid substantially changing the existing X/Y/Z datum configuration of the carriage, a unique interconnect scheme is employed. In that regard, the X-axis cartridge datums 65 engage the X-axis carriage datums 66, and the Y-axis cartridge datums 67 engage the Y-axis carriage datums 68, and the Z-axis cartridge datums 69 engage the Z-axis carriage datums 70 in a manner more fully described in the copending applications identified above and incorporated by reference herein.

Figure 9:
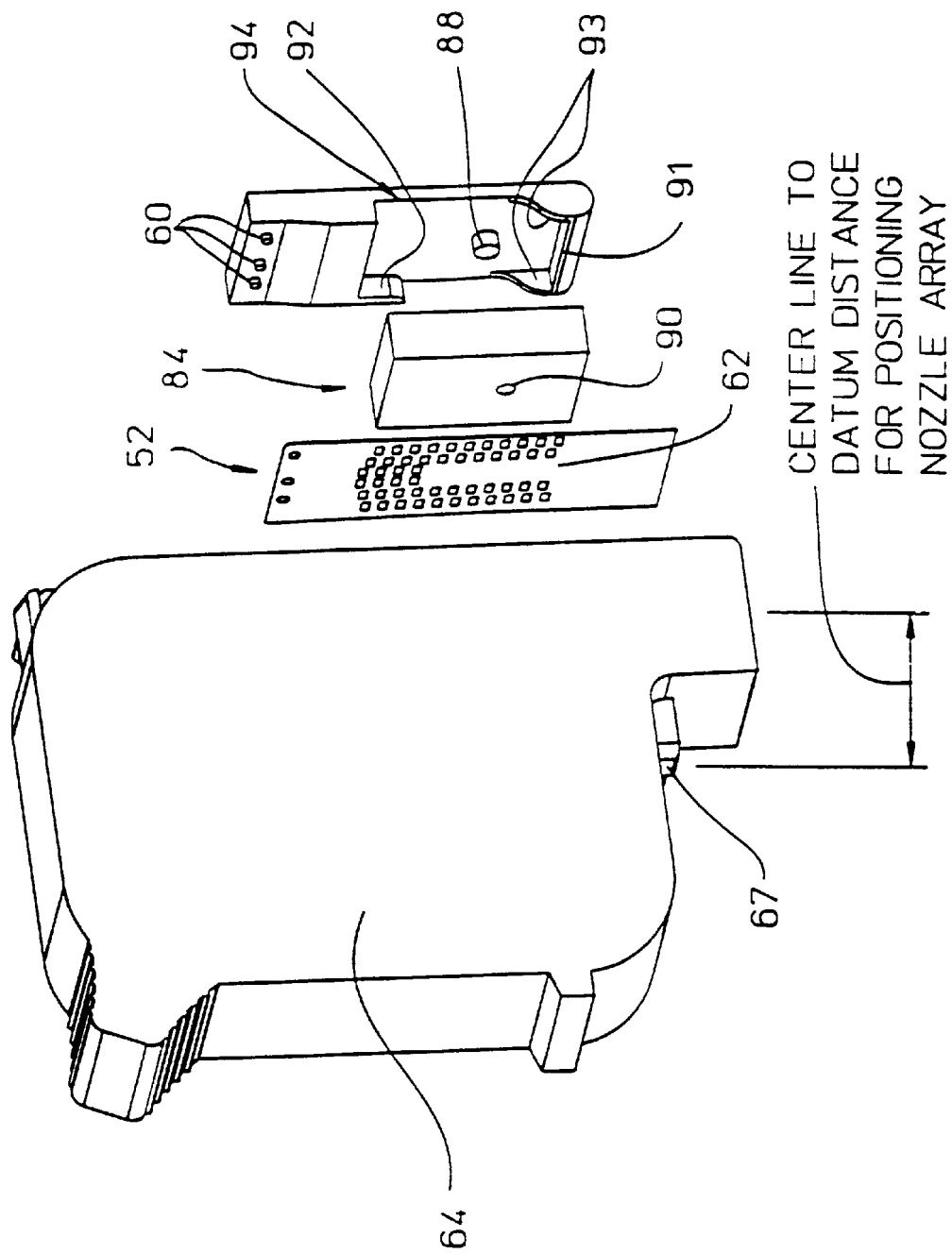
FIG. 9 is a schematic view showing the use of a foam member for operatively connecting a flex-circuit to a higher resolution black inkjet cartridge.
Figure 10:
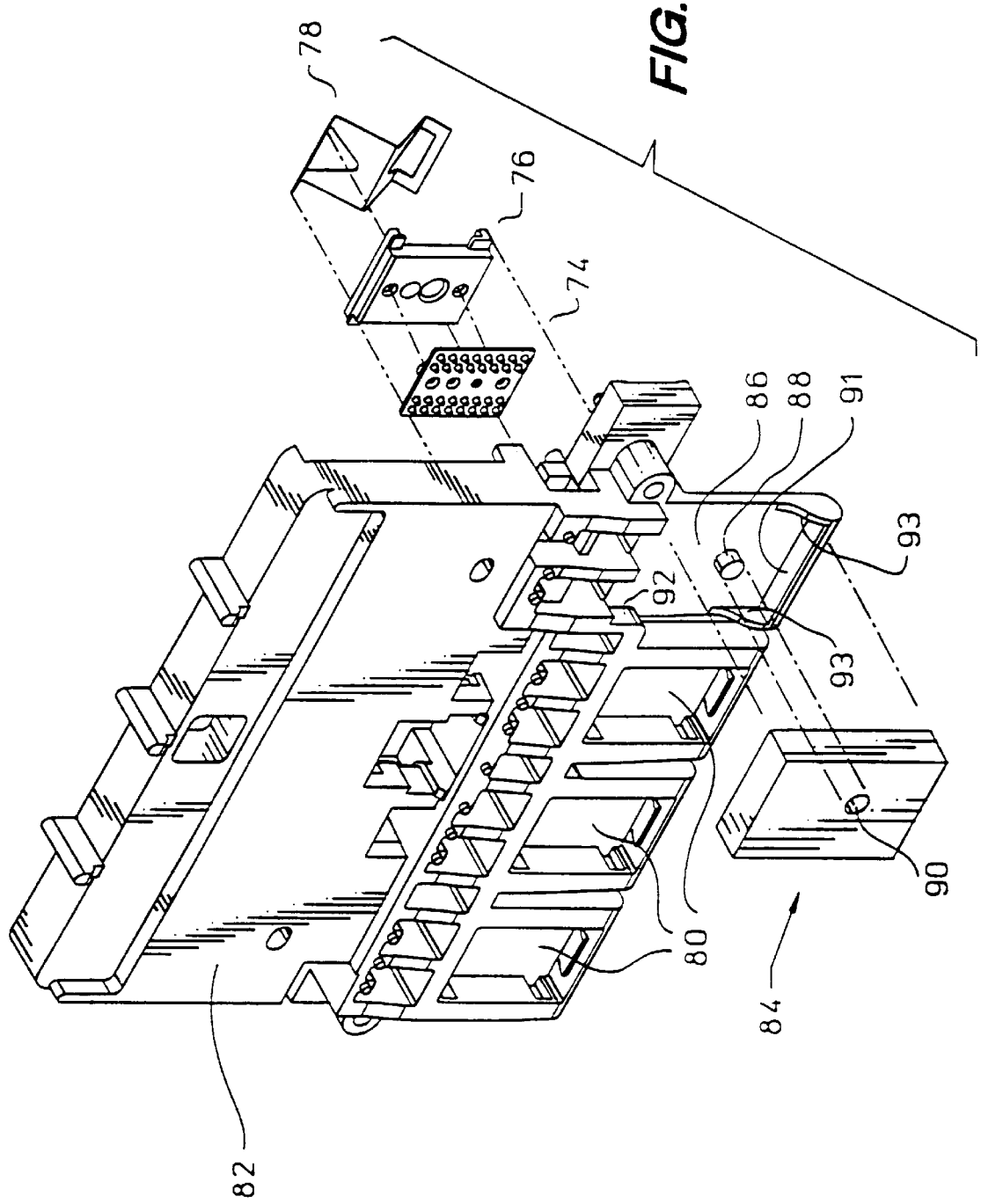
FIG. 10 is an exploded view showing a flex-circuit frame portion of a carriage, with the foam member of FIG. 9 for assuring pressure connection of a flex-circuit to a higher resolution black inkjet cartridge, and a metal spring member for assuring pressure connection of a flex-circuit to lower resolution color inkjet cartridges.
Figure 11:
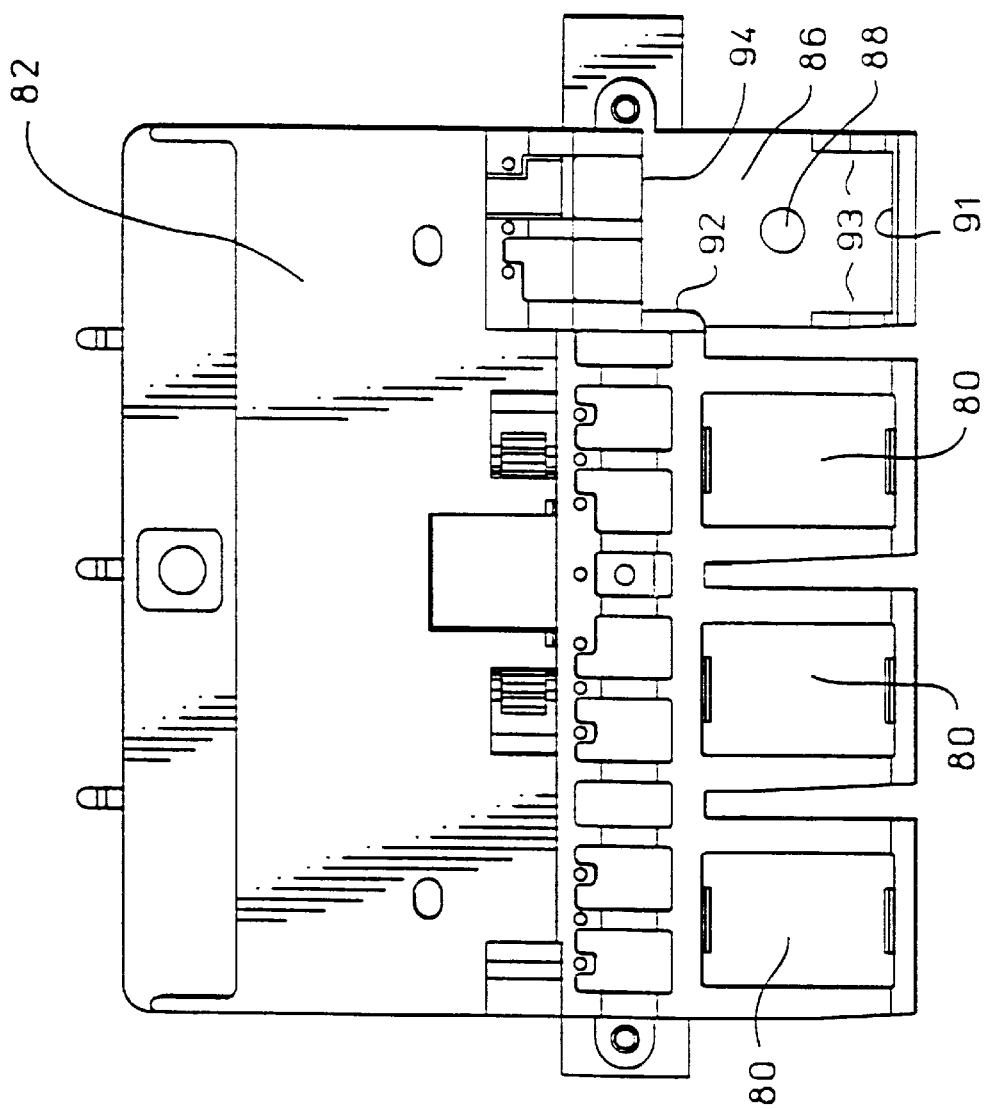
FIG. 11 is a front view of the flex-circuit frame of FIG. 10.

As best shown in FIGS. 9–11, a previously existing spring assembly including a backing sheet 74, a plate 76 and a gimbal spring 78 are sized for fitting into apertures 80 of flex-circuit frame 82 to assure proper electrical interconnection for the three color cartridges. Such resilient structure is described more fully in copending applications identified above and incorporated herein by reference.

A unique spring assembly for the 600 dpi cartridge interconnect includes an unitary resilient foam member 84 which fits in a seat 86 which is larger than the aperture 80. A mounting peg 88 fits into matching hole 90 which along with bottom and lower ledges 91, 93 and upper side and top ledges 92, 94 hold the foam member in proper position to assure operative engagement across the electrical interconnect. The structure and function of the flex-circuit frame, which has been modified to incorporate the unique features of the present invention, is described more fully in copending applications identified above and incorporated herein by reference.

Figure 7:
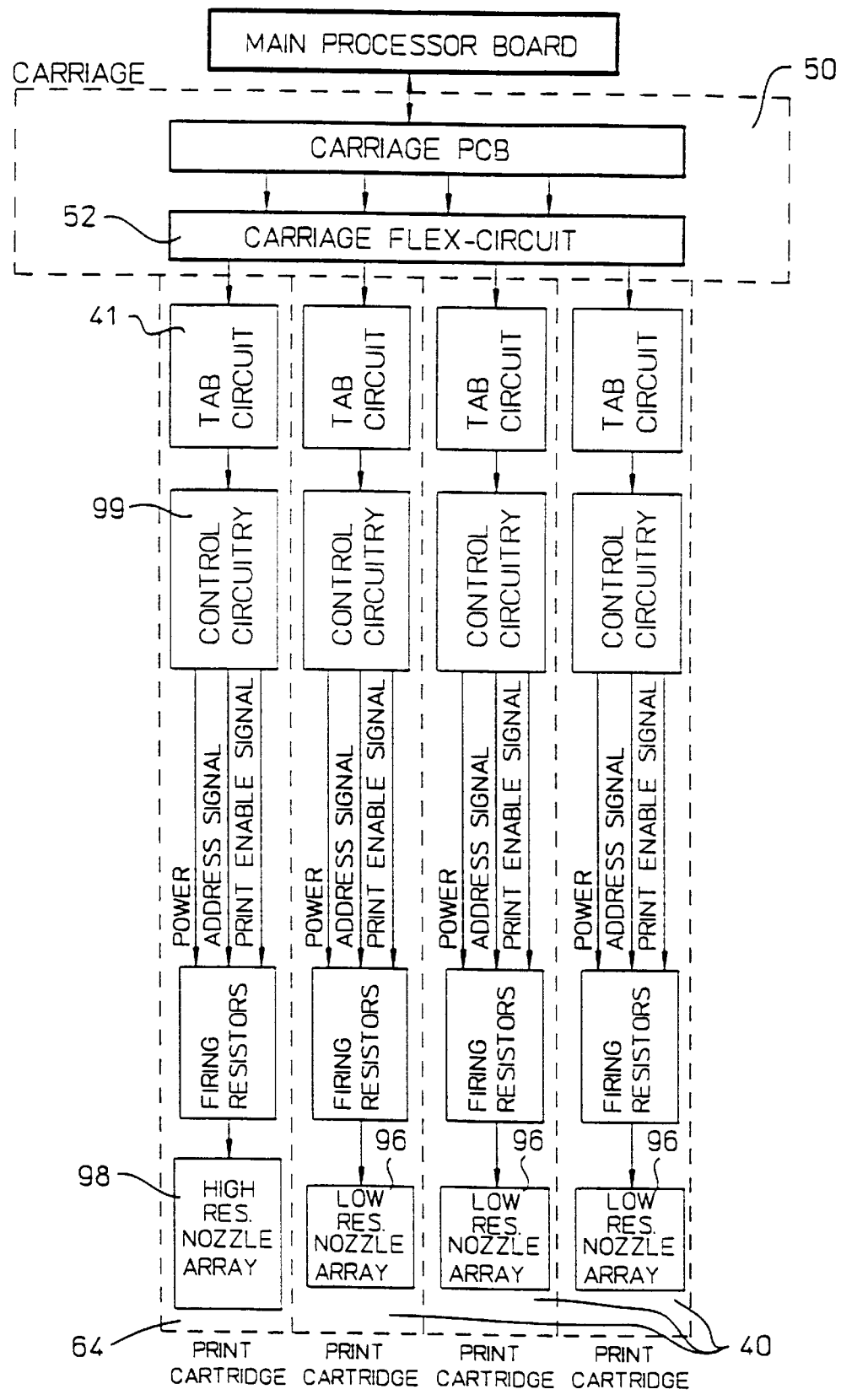
FIG. 7 is a schematic block diagram of the presently preferred embodiment of the invention.
Figure 8:
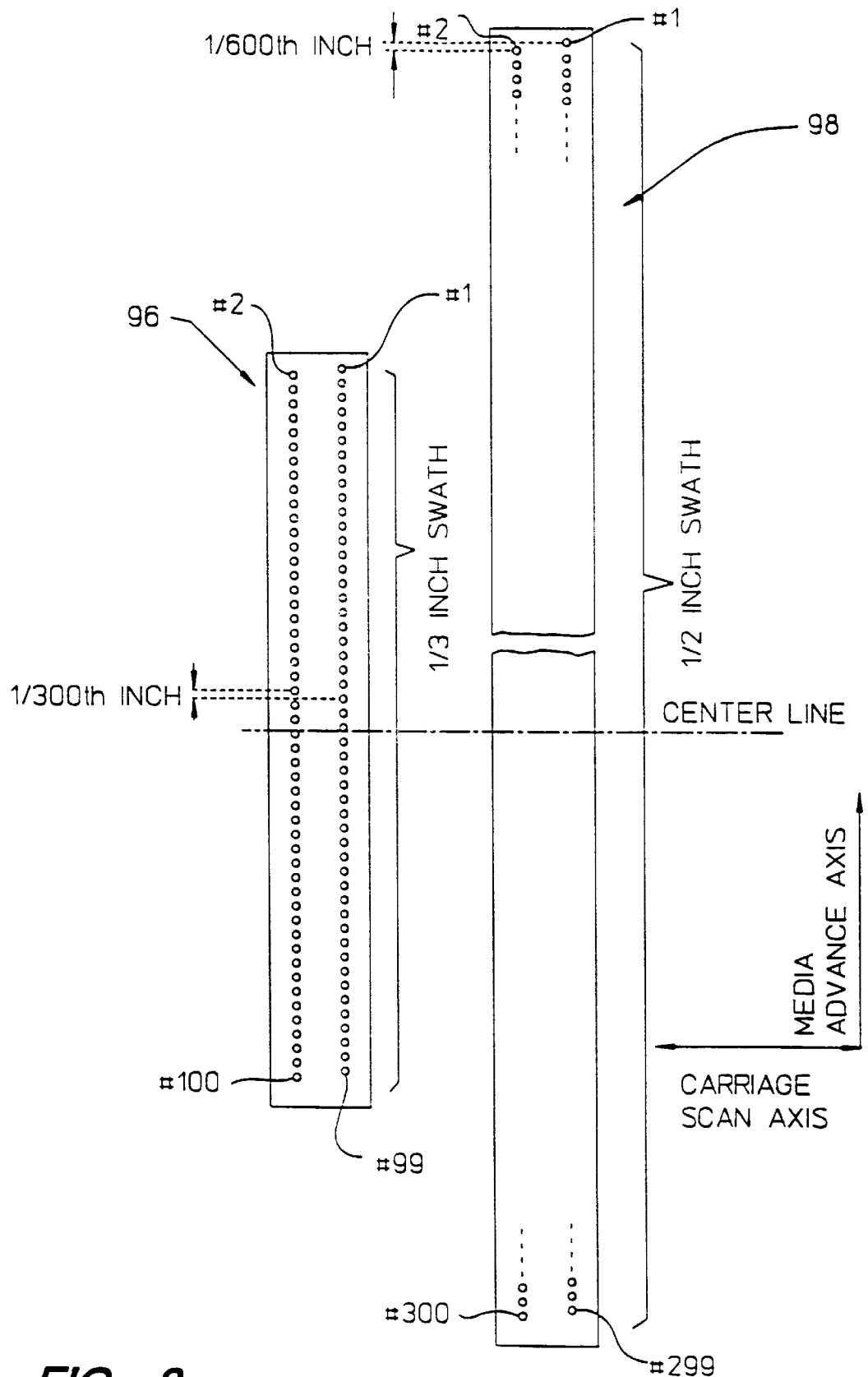
FIG. 8 is a schematic bottom view as seen looking up from the media showing the alignment relationship of the nozzle arrays of FIG. 7.

FIGS. 7–8 show the preferred mounting relationship between a 300 dpi nozzle array 96 of the color printheads and a 600 dpi nozzle array 98 of the black printhead. Control circuitry 99 on the substrate enables the three hundred firing resistors of the black printhead to be controlled through fifty-two electrical interconnect pads, and similarly enables all one hundred four firing resistors of each color printhead to be controlled through thirty-two electrical interconnect pads. The multiplexing circuit scheme for such control circuitry is described more fully in copending applications identified above and incorporated herein by reference.

Figure 12:
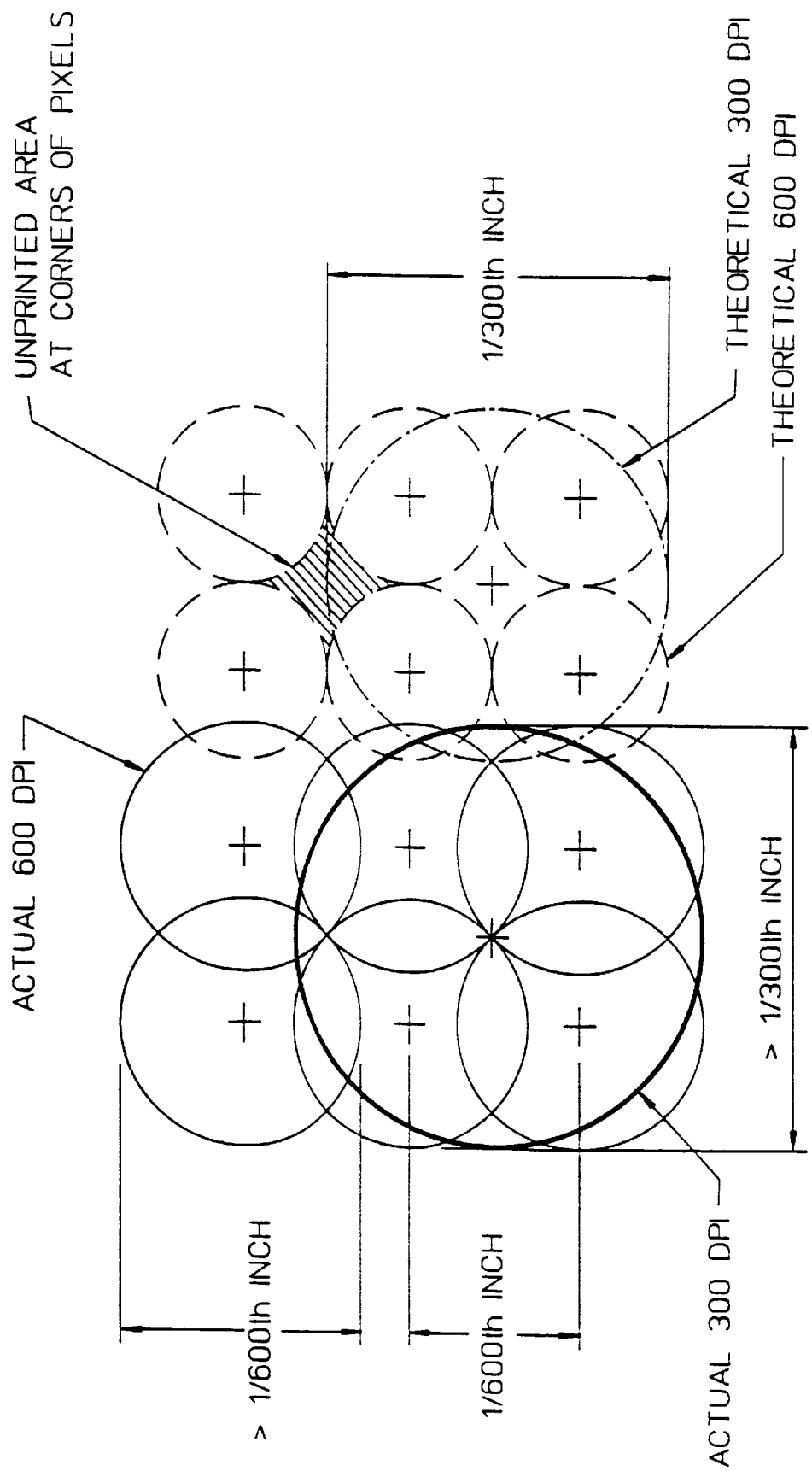
FIG. 12 is a schematic diagram showing the relative resolution between a 600 dpi printout of the black printheads and a 300 dpi printout of the color printheads of a presently preferred embodiment of the invention.

FIG. 12 schematically shows the difference between the 300 dpi printout produced by the color pens (i.e., pen cartridges) and the 600 dpi printout of the black pen of the preferred embodiment described herein. Of course, it would be possible to incorporated different combinations of resolution in different printheads wherein the resolution difference may be arbitrary, depending on the printheads available and already developed, or wherein the resolution difference may be decimally related (e.g., 20% greater resolution, 30% greater resolution, etc.) or fractionally related (300 dpi with 400 dpi; 300 dpi with 450 dpi, etc.). In that regard, the invention can be implemented with any of the existing inkjet cartridges which are currently available, with the best results occurring with printheads in the range of 180 dpi or greater.

It will therefore be appreciated by those skilled in the art that the invention as shown and described herein allows different types of interconnects and different types of print cartridges such as cartridges of different print resolutions to be used in one product.

This invention allows higher resolution and speed to occur for frequently printed features such as text and the most frequent color components of graphics such as black. Thus by printing these frequent features and components faster and at a higher resolution, the entire page is faster and of higher quality and is more comprable with laser printing performance (8+ pages per minute) and laser printing quality (600 dpi resolution).

The new form of resilient interconnect member disclosed herein allows for optimization and customization for the particular contact pattern of different cartridges in the same carriage. Thus, the size of the carriage and the way that the cartridge is held in the carriage has to change very little between subsequent generations of printers. In other words, the required design change to the printer is minimized, the carriage does not have to grow wider nor taller, and the printer does not have to grow wider nor taller.

While specific illustrated embodiments have been shown and described, it will be appreciated by those skilled in the art that various modifications, changes and additions can be made to the methods, structures and apparatus of the invention without departing from the spirit and scope of the invention as set forth in the following claims.

We claim as our invention:

1. A printer/plotter with a carriage for removably mounting at a same time a plurality of printheads including a first printhead of one color ink having first electrical interconnect means for receiving print activation signals from printer control circuitry and a second printhead of another color ink having second electrical interconnect means for receiving print activation signals from the printer control circuitry, said second electrical interconnect means being different in area and configuration from said first electrical means, and said first printhead and said second printhead each having a same external size and a same external datum configuration, comprising:

a frame for holding media in a print zone;

a carriage support on said frame to be positioned adjacent to said print zone including carriage mounting chutes each having a same predetermined chute width along a carriage axis for locating said first printhead and said second printhead in at least partially overlapping positions along said carriage axis; and carriage flex-circuit members in said chutes with each flex-circuit member having a first conductive assembly for pressurized engagement with the first electrical interconnect means or a second conductive assembly for pressurized engagement with the second electrical interconnect means, respectively, with said first and said second conductive assemblies each having a different size and a different configuration, for printing by the first printhead and the second printhead on the media.

2. The printer/plotter of claim 1 wherein said first printhead includes a black printhead and said second printhead includes a color printhead.

3. The printer/plotter of claim 2 wherein said second printhead generates a color component selected from a group consisting of cyan, magenta, yellow, red, green and blue.

4. The printer/plotter of claim 2 wherein said black printhead has a higher resolution than said color printhead.

5. The printer/plotter of claim 1 wherein said first conductive assembly includes a first array of conductive pads matching said first electrical interconnect means, and said second conductive assembly includes a second array of conductive pads matching said second electrical interconnect means, with said first array being different in size and configuration from said second array.

6. The printer/plotter of claim 5 wherein said first array covers a greater area than said second array.

7. The printer/plotter of claim 5 wherein said first array has a greater number of conductive pads than said second array.

8. The printer/plotter of claim 5 wherein said first array has more columns of conductive pads than said second array.

9. The printer/plotter of claim 5 wherein said first printhead has a wider printing swath than said second printhead.

10. The printer/plotter of claim 5 wherein said first printhead has a higher resolution than said second printhead.

11. The printer/plotter of claim 1 wherein said first printhead is a black printhead and said second printhead includes three color printheads.

12. A printer/plotter comprising:

a frame including means for advancing media in a media advance axis through a print zone;

a carriage mounted on said frame for traversing in a carriage scan axis across said print zone;

first print means including a black component for printing at a first print resolution;

second print means including a color component for printing at a second print resolution different from said first print resolution; and means for mounting said first and second print means on said carriage in at least partial alignment for printing on the media in said print zone, said mounting means including a first electrical interconnect for receiving signals for said first print means and a second electrical interconnect for receiving signals for said second print means, said first electrical interconnect having a configuration different from said second electrical interconnect.

13. The printer/plotter of claim 12 wherein said mounting means further includes carriage interconnect means having a first conductive assembly for engaging said first electrical interconnect means and a second conductive assembly for engaging said second electrical interconnect means, wherein said first conductive assembly includes a first array of conductive pads matching said first electrical interconnect and said second conductive assembly includes a second array of conductive pads matching said second electrical interconnect, with said first array being different size and configuration from said second array.

14. The printer/plotter of claim 13 wherein said first print resolution is greater than said second print resolution, and said first array has a greater number of conductive pads than said second array.

15. The printer/plotter of claim 13 wherein said first print resolution is greater than said second print resolution, and said first array covers a larger area than said second array.

16. The printer/plotter of claim 13 wherein said first and second arrays are each on a flex-circuit member.

17. The printer/plotter of claim 13 wherein said first array includes first resilient means for operatively engaging said first electrical interconnect when said first print means is mounted on said carriage; and said second array includes second resilient means for operatively engaging said second electrical interconnect when said second print means is mounted on said carriage.

18. The printer/plotter of claim 17 wherein said first resilient means includes foam means for operatively engaging said first electrical interconnect, and said second resilient means includes metal spring means for operatively engaging said said second electrical interconnect, said metal spring means being different from said foam means.

19. The printer/plotter of claim 12 wherein said first print means includes a black inkjet cartridge, and said second print means includes at least one color inkjet cartridge.

* * * * *